US007302744B1

(12) United States Patent
Huang

(10) Patent No.: US 7,302,744 B1
(45) Date of Patent: Dec. 4, 2007

(54) METHOD OF FABRICATING AN ACOUSTIC TRANSDUCER ARRAY

(75) Inventor: Dehua Huang, Portsmouth, RI (US)

(73) Assignee: The United States of America represented by the Secretary of the Navy, Washington, DC (US)

( * ) Notice: Subject to any disclaimer, the term of this patent is extended or adjusted under 35 U.S.C. 154(b) by 401 days.

(21) Appl. No.: 11/076,111

(22) Filed: Feb. 18, 2005

(51) Int. Cl.
*H01L 41/22* (2006.01)
*H01L 41/00* (2006.01)
*G10K 11/00* (2006.01)

(52) U.S. Cl. ......................... 29/25.35; 29/594; 29/595; 29/830; 29/841; 367/153; 310/311

(58) Field of Classification Search ............... 29/25.35, 29/594, 595, 884, 841, 830; 367/153, 140, 367/154, 155, 157; 310/334, 338, 322, 367; 156/48, 50, 46, 121, 122, 89.12, 89.14
See application file for complete search history.

(56) References Cited

U.S. PATENT DOCUMENTS 4,305,014 A * 12/1981 Borburgh et al. ........... 310/334
4,425,525 A * 1/1984 Smith et al. ................ 310/336
5,111,805 A 5/1992 Jaggy et al.
5,182,485 A 1/1993 de la Fonteijne
5,497,540 A * 3/1996 Venkataramani et al. .. 29/25.35
5,632,841 A 5/1997 Hellbaum et al.
5,796,207 A * 8/1998 Safari et al. ................ 310/358
6,104,126 A * 8/2000 Gilmore ..................... 310/334
6,263,550 B1 7/2001 Seipler et al.
6,634,071 B2 10/2003 Benjamin

* cited by examiner

*Primary Examiner*—A. Dexter Tugbang
*Assistant Examiner*—Tai Van Nguyen
(74) *Attorney, Agent, or Firm*—James M. Kasischke; Jean-Paul A. Nasser; Michael P. Stanley

(57) ABSTRACT

A method that involves establishing the performance level of a proposed acoustic transducer array. Deriving a geometric shape for the array based on the established performance level. Selecting piezoceramic materials based on considerations related to the performance level and derived geometry. Forming small primary shapes of the selected piezoceramic materials for use as the basic elements of the larger derived geometric shape of the array. Arranging the basic elements into a mosaic of the larger derived geometric shape. Filling the interstices between the basic elements with urethane to bind the mosaic of basic elements thereby fabricating the completed piezoceramic transducer array.

8 Claims, 4 Drawing Sheets

METHOD OF FABRICATING AN ACOUSTIC TRANSDUCER ARRAY

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER RELATED APPLICATIONS

Not applicable.

BACKGROUND OF THE INVENTION (1) Field of the Invention

The present invention relates generally to methods of processing piezoceramic transducer arrays, and more particularly to a new method for processing piezoceramic acoustic transducer arrays based on the mosaic arranging of piezoceramic materials with urethane.

(2) Description of the Prior Art

Piezoceramic acoustic transducer material has found its applications in underwater acoustic sonar transducers and arrays and has shown promising performance.

Currently, the great majority of the sonar transducer arrays are composed of piezoceramic transducer elements that are identical with respect to their physical sizes, to their shapes and to the type of materials used to manufacture them. The advantage of maintaining uniform size, shape and material is to maintain control in the quality of the transducer characteristics. There is, however, a disadvantage in maintaining a rigid uniformity. The trade-off is a loss in the flexibility of sonar array design that is limited to specific shapes and sizes.

There is a need for a new method of manufacturing underwater acoustic transducer arrays. Such a method should provide the means to manufacture piezoceramic transducer arrays with predetermined specific attributes and performance expectations. It should encompass any arbitrary surface geometry possible using numerical simulation techniques, and should not be restricted to only certain shapes of piezoceramic materials in order to optimize the acoustical performance in a controllable fashion when such piezoceramic materials are at the preliminary stage of manufacturing the transducer array. What is needed is a mosaic process for the fabrication of acoustic transducer arrays.

SUMMARY OF THE INVENTION

It is a general purpose and object of the present invention to provide a method for fabricating acoustic transducer arrays made of piezoceramic material.

A still further object of the invention is to provide a method for fabricating acoustic transducers of shaped piezoceramic material elements in which the shape of the piezoceramic elements conforms to a given array geometry.

A still further object of the invention is to provide a method for fabricating acoustic transducer arrays that only uses the minimum amount of piezoceramic material necessary to limit excess piezoceramic material that would otherwise interfere with the function of the transducer array.

These objects are accomplished in accordance with the present method according to the following. A desired performance level for a proposed acoustic transducer array is established. A geometric shape for the array is derived, based on the established performance specifications, such as the array beam pattern, side lobe suppression, sensitivities and impedance. Basic elements of the array are formed from piezoceramic materials of varying shapes rather than the using a uniform shape. These basic elements are then arranged in a mosaic method into the geometric shape for the array that was derived. The interstices are filled with urethane to link the basic elements together, thereby forming the entire piezoceramic transducer array.

DESCRIPTION OF THE PREFERRED EMBODIMENT

The first step of the method is to determine the utilization and performance expectations of the acoustic transducer array. In the preferred embodiment, the utilization will be for acoustic transducer arrays utilized in underwater sonar applications. The performance expectations will be linked to the type of acoustic beam pattern sought, the degree of side lobe suppression, the weighting, the impedance, the transmitting voltage response and the receiving response. Once a determination of utilization and performance expectations has been made, a unique geometry can be derived through both physical prototyping and computer modeling that satisfies these expectations. For example, in referring to FIG. 1, the acoustic transducer array 10 is in a star shaped geometric pattern similar to a compass rose. This geometric pattern was derived through physical prototyping and computer modeling commonly known and used in the art. An acoustic transducer with this geometric pattern exhibits a significant degree of side lobe suppression. It will be appreciated that a variety of different surface geometries are possible depending upon the desired performance requirements, and the invention is therefore not limited to the example illustrated herein.

The next step is to choose the appropriate types of piezoceramic materials to use. The selections are based on which piezoceramic materials best satisfy the performance expectations and can include PZT-5. Once the materials are selected, electrodes (not shown) are applied to the top and bottom surfaces of the material. In the preferred embodiment, electrodes are applied before the mosaic fabrication of the acoustic transducer. The electrode surfaces may be formed using techniques currently known in the art such as copper or silver plating and the like.

Figure 1:
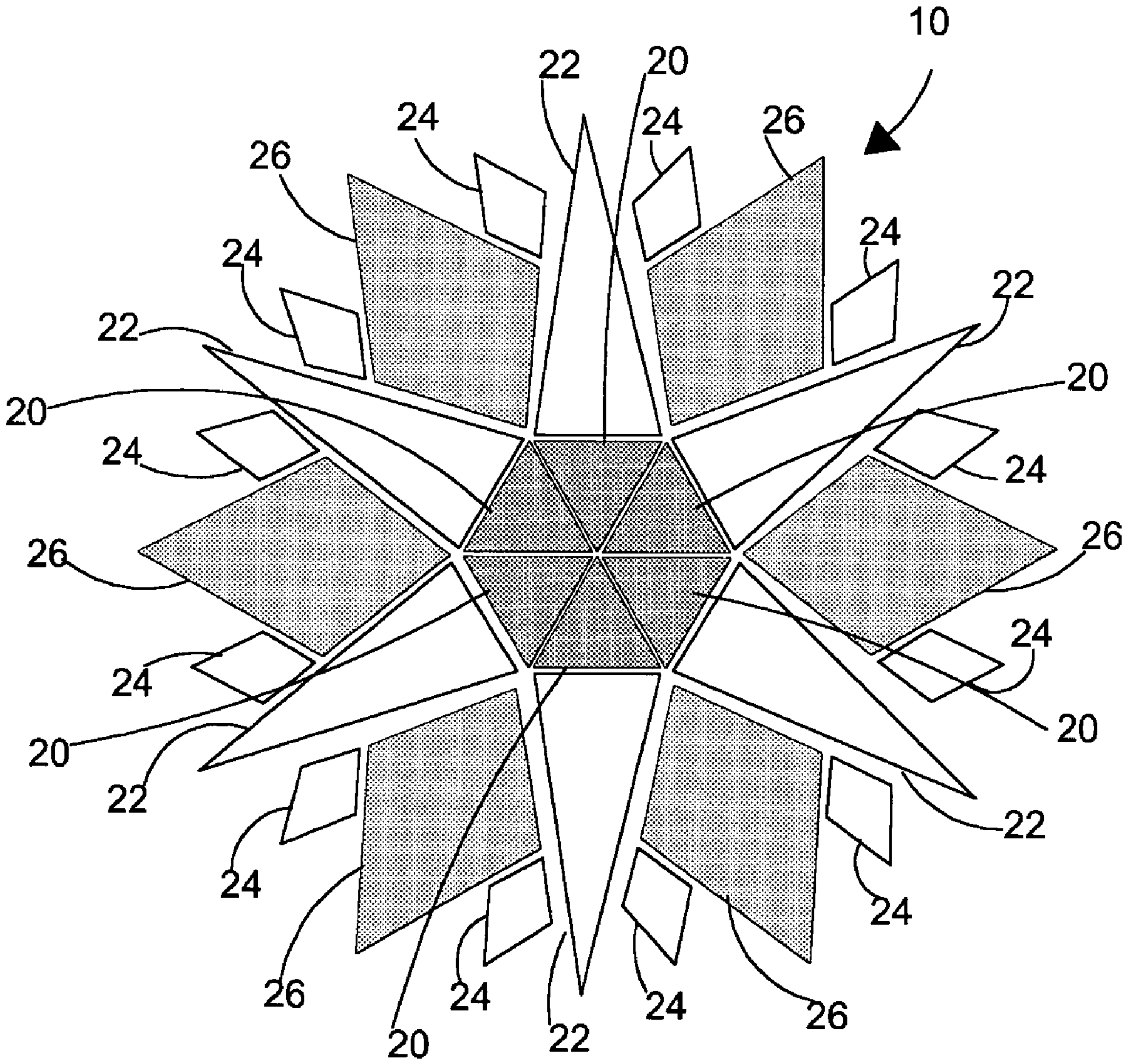
FIG. 1 illustrates the different piezoceramic shapes arranged in a mosaic of a larger specific pattern.
Figure 2:
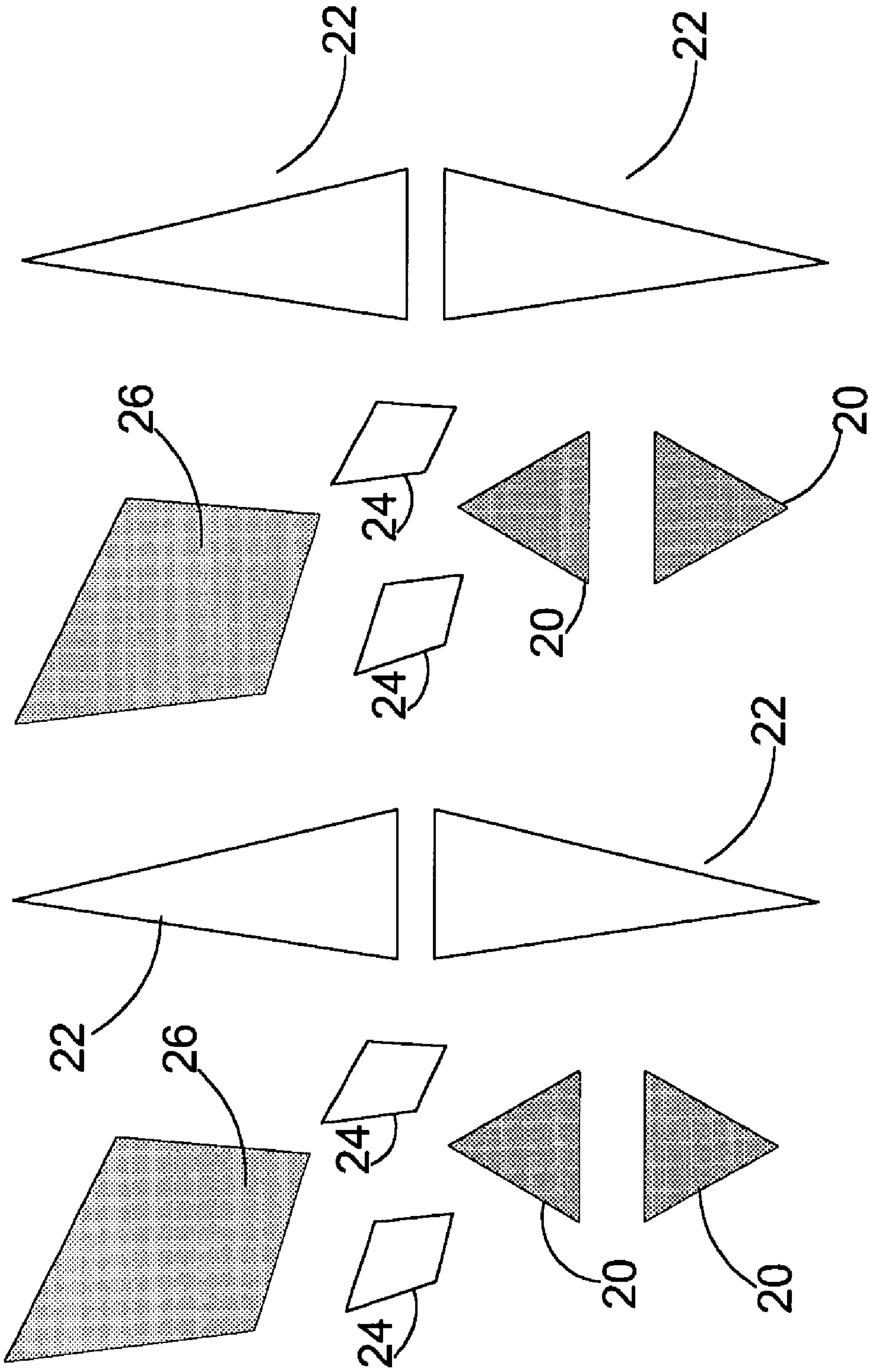
FIG. 2 illustrates different piezoceramic materials cut into different shapes.

The next step is to cut the selected piezoceramic material into various smaller shapes to fabricate the transducer array. These smaller shapes as illustrated in FIG. 1 are the basic elements from which the larger geometric pattern of the transducer array is fabricated using the mosaic process. The basic elements will serve as the building blocks of the geometric shape for the larger piezoceramic transducer array, much as colored tiles serve as the fundamental components of a larger mosaic image. The shape of the basic elements will depend upon the larger geometric shape of the acoustic transducer array that is to be fabricated. In FIG. 2, the basic elements 20, 22, 24 and 26 are shaped into triangles of specific length and angle size. It is important to note that more than one shape of triangle is used, and that the various individual basic elements 20, 22, 24 and 26 can be made of different piezoceramic material as illustrated by the shading in FIG. 2.

Figure 3:
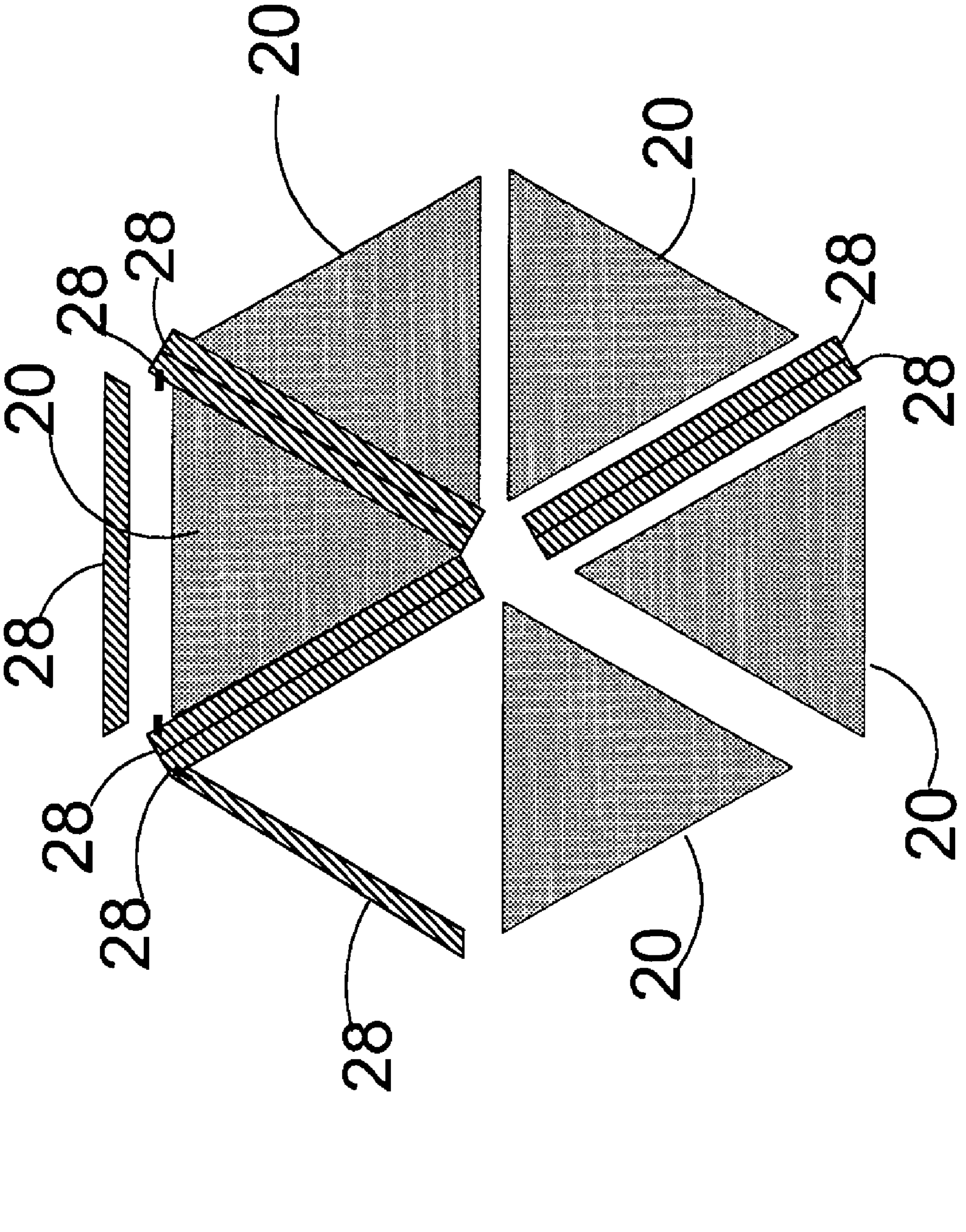
FIG. 3 illustrates the different piezoceramic shapes being arranged using mechanical frames.
Figure 4:
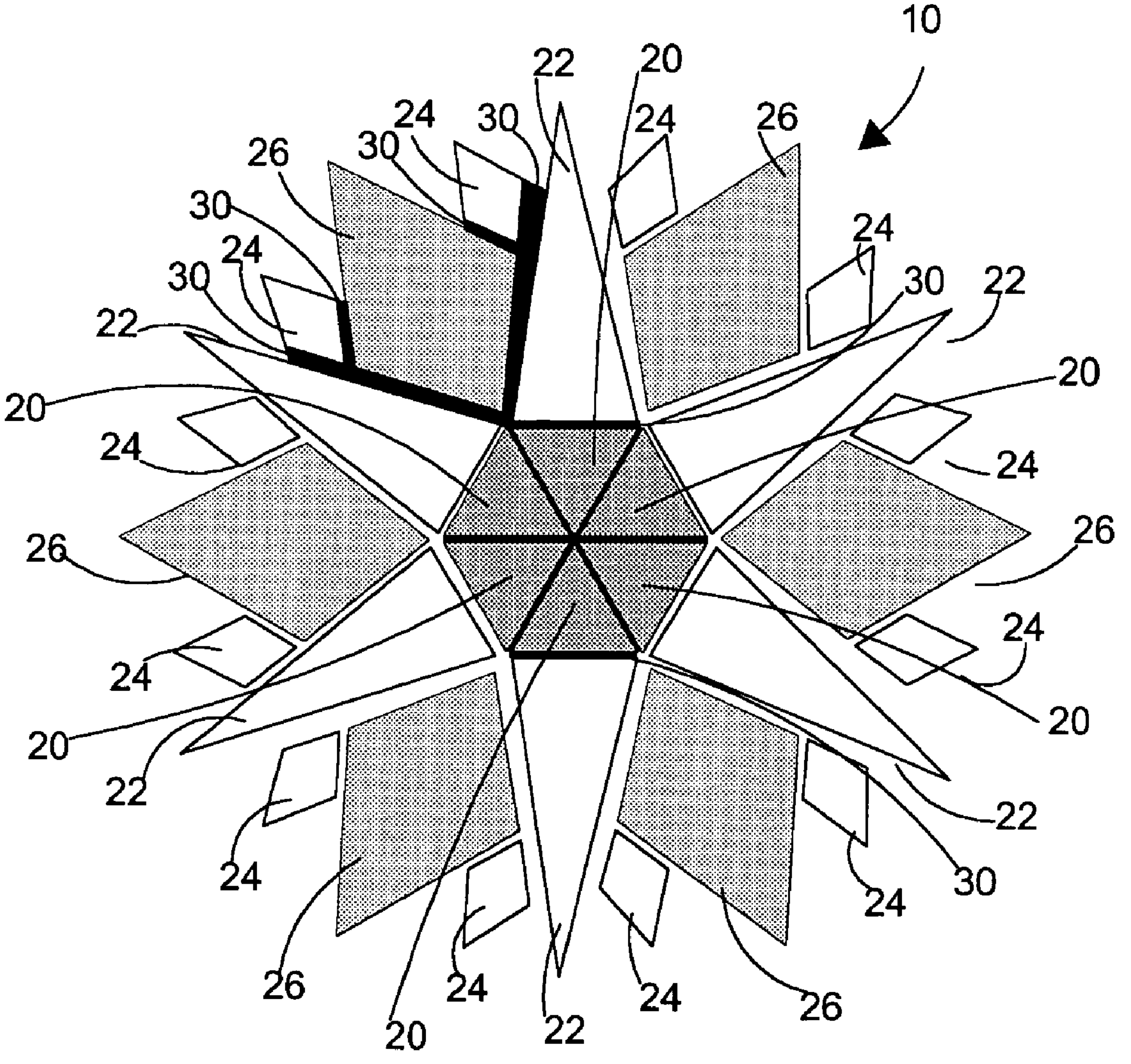
FIG. 4 illustrates a piezoceramic acoustic transducer array composed of a mosaic of smaller different piezoceramic shapes bound together by urethane.

The basic elements are arranged in a mosaic method using mechanically adjustable frames 28 as illustrated in FIG. 3 specifically designed to hold the basic elements in place to form the desired geometric shape of the piezoceramic transducer array. Each separate basic element is arranged at precise measured angles and orientation to the other elements based on the derived unique geometry of the acoustic transducer array. Referring now to FIG. 4, once all of the basic elements are arranged as a mosaic into the derived geometric shape, the frames are carefully removed, and urethane 30 is then used to fill in the interstices between the basic elements. As the urethane 30 cures, it bonds the mosaic of separate basic elements into the larger derived geometric shape. It is important to keep the electrodes free of the urethane 30 bonding material. Once curing is accomplished, it may be necessary to smooth out the urethane 30 to maintain consistent shape and height.

The main advantage of the present invention over the prior art is that by arranging piezoceramic basic elements into a mosaic to fabricate a larger piezoceramic transducer array of a predetermined derived geometric shape there is a dramatic increase in flexibility with regard to the derived geometric shapes that can be used to suit the needs of a sonar application. Rather than taking a large block of piezoceramic material and attempting to shape it to suit the needs of the sonar application, or rather than using different shaped electrodes on a single large block of piezoceramic material where parts of the block have no electrode contact, a mosaic arrangement of piezoceramic materials ensures a precise geometric shape and ensures that there is no "extra" piezoceramic material (i.e. material having no electrode contact). By modifying the actual shape of the piezoceramic material itself (rather than the electrodes) there is no extra piezoceramic material that would otherwise interfere with the performance. In this way there is better isolation of the piezoceramic material and only the desired areas are excited. Thus, the mosaic method of arranging basic elements allows a mixture of different cross sectional geometry patterns for optimization of acoustic transducer array performance such as side lobe suppression, bandwidth manipulation and increases or decreases in sensitivities.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed is:

1. A method of fabricating an acoustic transducer array comprising the steps of:

determining the performance requirements of the acoustic transducer array;

deriving a geometric shape for the acoustic transducer array based upon said performance requirements;

selecting appropriate piezoceramic materials with which to fabricate the acoustic transducer array;

shaping the piezo-ceramic material into a plurality of basic elements;

arranging said plurality of basic elements into said derived geometric shape for said acoustic transducer array; and filling the interstices of the arranged plurality of basic elements with non-piezo bonding material.

2. A method according to claim 1 wherein the step of deriving the geometric shape for the acoustic transducer array involves physical prototyping.

3. A method according to claim 1 wherein the step of deriving the geometric shape for the acoustic transducer array involves computer modeling.

4. A method according to claim 1 wherein the step of selecting appropriate piezoceramic materials involves considering ceramic properties.

5. A method according to claim 4 wherein the step of selecting appropriate piezoceramic materials is limited to selecting piezoceramic materials in the PZT-5 family.

6. A method according to claim 1 wherein the step of shaping the piezo-ceramic material into a plurality of basic elements further comprises the steps of:

providing at least one large block of piezo-ceramic material;

applying conductive electrodes to both sides of said at least one large block of piezo-ceramic material; and dicing said at least one large block of piezo-ceramic material into smaller said basic elements of different shapes.

7. A method according to claim 1 further comprising the steps of:

allowing said non-piezo bonding material to cure; and smoothing out the acoustic transducer to maintain even shape and height.

8. A method according to claim 1 wherein the non-piezo bonding material is a urethane.

* * * * *